(12) United States Patent
Srivastava

(10) Patent No.: US 7,902,021 B2
(45) Date of Patent: Mar. 8, 2011

(54) METHOD FOR SEPARATELY OPTIMIZING SPACER WIDTH FOR TWO OR MORE TRANSISTOR CLASSES USING A RECESS SPACER INTEGRATION

(75) Inventor: Anadi Srivastava, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 765 days.

(21) Appl. No.: 11/365,059

(22) Filed: Feb. 28, 2006

(65) Prior Publication Data

US 2007/0202643 A1    Aug. 30, 2007

(51) Int. Cl.
*H01L 21/8238* (2006.01)

(52) U.S. Cl. ......... 438/230; 438/197; 438/270; 438/275; 438/303; 438/735; 438/911; 257/E21.626; 257/E21.64

(58) Field of Classification Search .................. 438/303, 438/197, 230, 275; 257/E21.626, E21.64
See application file for complete search history.

(56) References Cited

U.S. PATENT DOCUMENTS

| | | | |
|---|---|---|---|
| 6,169,017 B1 | 1/2001 | Lee | |
| 6,187,620 B1 * | 2/2001 | Fulford, Jr. et al. | 438/230 |
| 6,194,279 B1 * | 2/2001 | Chen et al. | 438/303 |
| 6,461,951 B1 | 10/2002 | Besser et al. | |
| 6,509,264 B1 | 1/2003 | Li et al. | |
| 6,696,334 B1 * | 2/2004 | Hellig et al. | 438/230 |
| 6,746,927 B2 | 6/2004 | Kammler et al. | |
| 2004/0087090 A1 * | 5/2004 | Grudowski et al. | 438/275 |
| 2004/0175890 A1 * | 9/2004 | Lee et al. | 438/275 |

* cited by examiner

*Primary Examiner* — Matthew E Warren
*Assistant Examiner* — David Z Chen
(74) *Attorney, Agent, or Firm* — John A. Fortkort; Fortkort & Houston P.C.

(57) ABSTRACT

A method for making a semiconductor device is disclosed. In accordance with the method, a semiconductor structure is provided which includes (a) a substrate (203), (b) first and second gate electrodes (219) disposed over the substrate, each of the first and second gate electrodes having first and second sidewalls, and (c) first (223) and second (225) sets of spacer structures disposed adjacent to the first and second gate electrodes, respectively. A first layer of photoresist (231) is then disposed over the structure such that the first set of spacer structures is exposed and the second set of spacer structures is covered, after which the first set of spacer structures is partially etched.

18 Claims, 4 Drawing Sheets

METHOD FOR SEPARATELY OPTIMIZING SPACER WIDTH FOR TWO OR MORE TRANSISTOR CLASSES USING A RECESS SPACER INTEGRATION

FIELD OF THE DISCLOSURE

The present disclosure relates generally to semiconductor devices, and more particularly to processes for forming spacers in such devices.

BACKGROUND OF THE DISCLOSURE

Spacer width is a useful parameter for controlling parasitic source/drain resistance in transistors. Transistor operation is typically optimized with a spacer width that moves source/drain junctions closer to the channel without over-running source/drain extensions. In conventional semiconductor processes, however, a single spacer width is used for all transistor devices in a circuit. This width is usually dictated by the subset of transistor devices that have the highest impact on product constraints. However, independent control of spacer widths for different transistor groups is desirable because it enables more extensive optimization of each group, thereby resulting in a greater overall device performance.

There is thus a need in the art for a method for making transistors and other semiconductor devices which permits the independent optimization of spacer widths for two or more transistor groups. These and other needs may be met by the devices and methodologies described herein.

DETAILED DESCRIPTION

In one aspect, a method for making a semiconductor device is provided herein. In accordance with the method, a semiconductor structure is provided which comprises (a) a substrate, (b) first and second gate electrodes disposed over the substrate, and (c) first and second sets of spacer structures disposed adjacent to said first and second gate electrodes, respectively. A first layer of photoresist is then disposed over the structure such that the first set of spacer structures is exposed and the second set of spacer structures is covered, after which the first set of spacer structures is partially etched.

These and other aspects of the present disclosure are described in greater detail below.

It has now been found that photoresist masking may be utilized in conjunction with recess etching to selectively create different recess depths and spacer widths on two or more transistor groups within a semiconductor device, thereby serving as a tool for transistor optimization. In accordance with this approach, each transistor group may be selectively opened to a recess etch to produce a recess depth and final spacer dimensions that optimize silicidation and transistor performance for that group. A high degree of independent optimization can be achieved with this process for as many transistor groupings as desired since, during the recess etching of any particular transistor group, all other transistor groups are resist-protected. Thus, for example, this approach can be used to independently optimize different transistor classes such as NMOS/PMOS FETs, Symmetric/Asymmetric FETs, thin gate oxide /thick gate oxide FETs, floating body/body tied SOI FETs, or memory cache/logic groupings, thereby achieving improved performance optimization for each device set. This approach can also be used to correct for localized circuit effects that impact only one device set, without impacting the entire circuit response.

Figure 1:
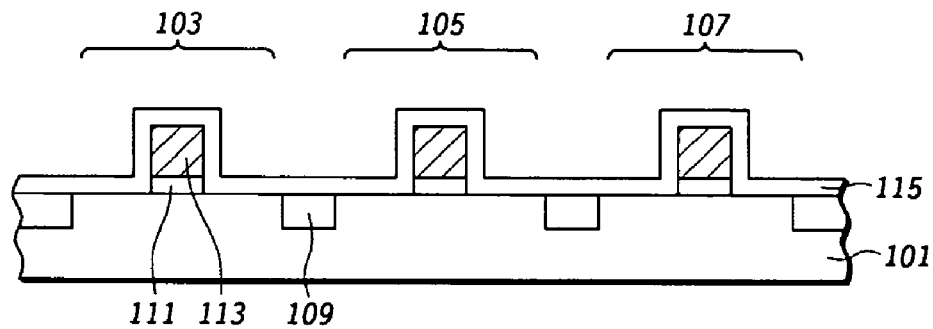
FIG. 1 is an illustration of one step in an embodiment of a process of the type described herein.

The methodologies described herein can be better understood in the context of the prior art process depicted in FIGS. 1-5 for producing devices with multiple spacer widths. Referring to FIG. 1, a substrate 101 is provided which contains a plurality of transistor regions 103, 105 and 107 thereon, each of which contains n and p wells (these have been omitted for simplicity of illustration). The transistor regions 103, 105, 107 are separated by shallow trench isolation regions 109. A bottom gate dielectric layer 111 and gate electrodes 113 are formed in each transistor region 103, 105, 107, and an oxide layer 115 is deposited on the substrate 101.

Figure 2:
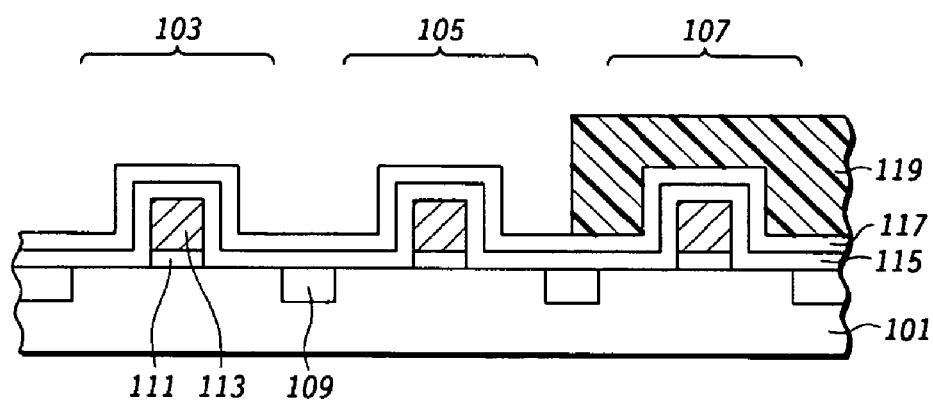
FIG. 2 is an illustration of one step in an embodiment of a process of the type described herein.

Referring to FIG. 2, a silicon nitride layer 117 is deposited on the oxide layer 115. The oxide layer 115 and silicon nitride layer 117 form a conformal coating on the gate electrodes 113 and on exposed portions of the substrate 101. A first photoresist mask 119 is formed in transistor region 107.

Figure 3:
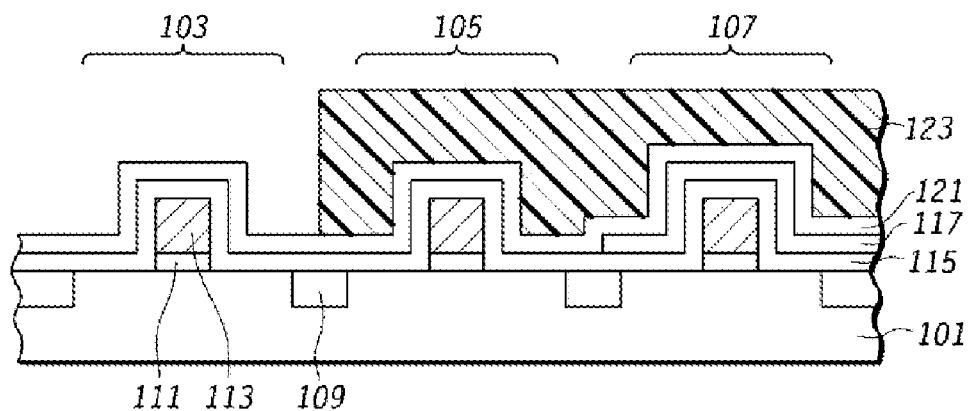
FIG. 3 is an illustration of one step in an embodiment of a process of the type described herein.

As shown in FIG. 3, the silicon nitride layer 117 is selectively removed from the transistor regions 103, 105 exposed by the first photoresist mask 119, after which the first photoresist mask 119 is stripped. A second silicon nitride layer 121 (with a similar thickness to silicon nitride layer 117) is then deposited as a conformal layer over the structure, after which a second photoresist mask 123 is formed over transistor regions 105, 107.

Figure 4:
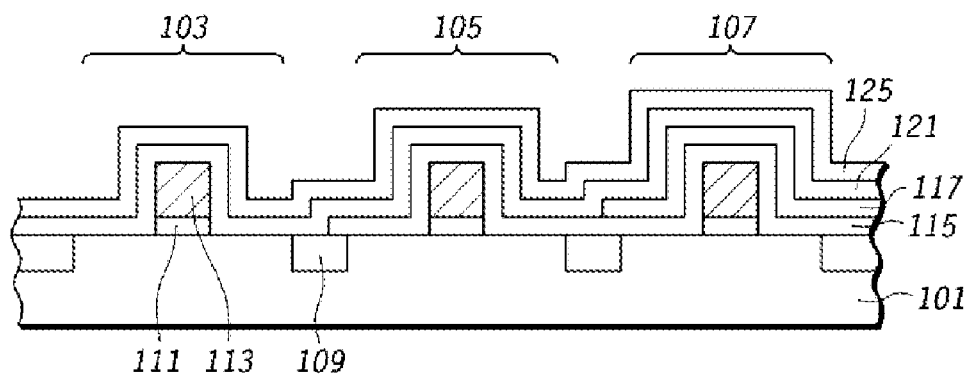
FIG. 4 is an illustration of one step in an embodiment of a process of the type described herein.

Referring to FIG. 4, the portion of the silicon nitride layer 121 in transistor region 103 which is exposed by the second photoresist mask 123 (see FIG. 3) is selectively removed, after which the second photoresist mask 123 is stripped. A third silicon nitride layer 125 (with a thickness similar to that of silicon nitride layer 117) is then deposited on substrate 101.

Figure 5:
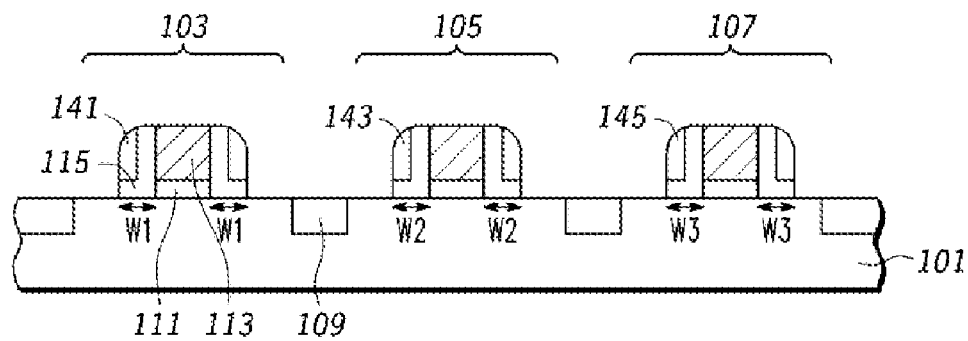
FIG. 5 is an illustration of one step in an embodiment of a process of the type described herein.

Referring to FIG. 5, an anisotropic etch is then utilized to produce silicon nitride spacers 141, 143 and 145 on the oxide layer 115 which is adjacent to the sidewalls of gate electrode 113 in transistor regions 103, 105, and 107, respectively. Since a single spacer etch is utilized, the same nitride etch conditions persist in each of the transistor regions 103, 105 and 107. However, since transistor region 105 has an additional silicon nitride layer 121 as compared to transistor region 103, and since transistor region 107 has an additional silicon nitride layer 125 as compared to transistor region 105 and has two additional silicon nitride layers 121 and 125 as compared to transistor region 103, the overetch results in different spacer widths $w_1$, $w_2$ and $w_3$ in transistor regions 103, 105 and 107, respectively, wherein $w_3 > w_2 > w_1$. Subsequent etching is performed to remove exposed portions of oxide layer 115, including portions of the oxide layer 115 above gate electrodes 113 and between nitride spacers 141, 143 and 145.

While the prior art process depicted in FIGS. 1-5 may ostensibly permit the formation of spacers which have different spacer widths in different transistor regions of a semiconductor device, it utilizes a single spacer etch, and hence a single etch chemistry, to ultimately define all of the recess and spacer dimensions in the device. Hence, this process does not permit the use of separate etch chemistries as may be required to optimize the various transistor groupings in a device. For example, it may be desirable to utilize etch chemistries having different degrees of anisotropy in different transistor regions so as to achieve different spacer widths for a given spacer recess depth. Moreover, the prior art process depicted in FIGS. 1-5 is unduly complex in that it requires the deposition of multiple layers of spacer material (and the associated masking and etching steps) which may have high thermal budgets, to achieve the required number of layers of spacer material in each transistor region. Furthermore, it relies heavily on a selective etch that can remove the spacer material in exposed areas while leaving photoresist-masked regions intact. In practice, such selective etches are difficult to achieve when the spacer material is silicon nitride.

Figure 6:
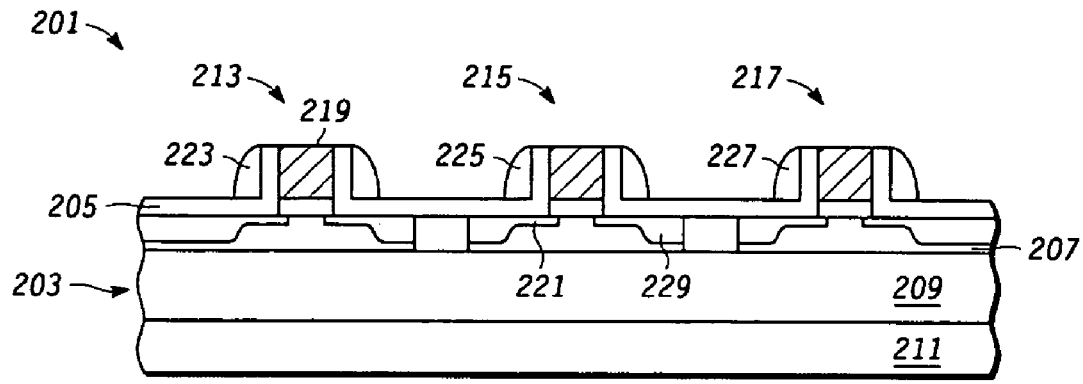
FIG. 6 is an illustration of one step in an embodiment of a process of the type described herein.

The aforementioned infirmities may be overcome by the methodologies described herein, a first, non-limiting embodiment of which is illustrated in FIGS. 6-11. With reference to FIG. 6, a semiconductor structure 201 is provided which comprises a semiconductor substrate 203 upon which is formed a gate dielectric film 205. The gate dielectric film 205 may be, for example, a silicon dioxide film formed by the thermal oxidation of the upper surface of semiconductor substrate 203. Thermal oxidation of substrate 203 may be achieved, for example, by exposing the wafer to an oxidizing atmosphere (e.g., $O_2$, $H_2O$, or the like) at a temperature in excess of 900° C.

Typically, the gate dielectric 205 has a thickness of anywhere from about 15 to about 150 angstroms. In some embodiments, the gate dielectric 205 may be a "high K" dielectric having a dielectric constant K which is greater than 4.0. High K dielectrics are desirable for use in gate dielectric films to achieve sufficient capacitance with a thicker film. High K materials suitable for use as the gate dielectric 205 include various metal-oxide compounds such as hafnium-oxide, as well as other materials including aluminum oxide, hafnium silicate, zirconium silicate, hafnium aluminate, lanthanum aluminate, zirconium aluminate, and lanthanum oxide.

The upper portion of semiconductor substrate 203 typically includes a monocrystalline semiconductor material such as silicon on which the gate dielectric 205 is formed. In one embodiment that is particularly suitable for use with low power applications such as mobile and wireless devices, semiconductor substrate 203 comprises a silicon-on-insulator (SOI) substrate in which the monocrystalline silicon 207 is a relatively thin film (i.e., less than 10,000 angstroms) and is formed over a buried oxide (BOX) 209 with a thickness roughly in the range of 1000 to 20,000 angstroms. The BOX 209 may, in turn, be formed over a handle wafer 211 or other substrate.

As seen in FIG. 6, three transistor devices 213, 215 and 217 have been defined. Each of these devices 213, 215, 217 comprises a gate electrode 219 which is formed over the gate dielectric 205. Preferably, gate electrode 219 is patterned from a polysilicon film. The gate electrode 219 is typically patterned using photolithography and anisotropic or dry etch techniques that are well known in the art. The photolithography may include the use of an anti-reflective coating (ARC) and photoresist patterning techniques.

The polysilicon film from which the gate electrode 219 may be patterned may be formed, for example, by the thermal decomposition of silane in a reactor chamber maintained at a temperature in the range of approximately 550-650° C. The polysilicon film is typically deposited as undoped silicon and is subsequently doped with an n-type (e.g., phosphorous, arsenic) or p-type (e.g., boron) dopant using ion implantation. The polysilicon film may be doped in-situ or by diffusion. In some embodiments, the gate electrode 219 may also comprise such materials as germanium, tantalum silicon nitride, titanium nitride, molybdenum nitride or a combination thereof, either in addition to or in lieu of polysilicon.

One or more implant steps may be performed after forming gate electrode 219 to introduce source/drain extension regions 221 into those portions of SOI layer 207 not covered by gate electrode 219. The source/drain extension regions 221 are desirable to control the threshold voltage and effective channel-length of the resulting device.

Referring still to FIG. 6, first 223, second 225 and third 227 sets of spacer structures are formed adjacent to the gate electrode 219. In some embodiments, the spacer film may comprise a low-K dielectric having a dielectric constant K of less than approximately 4.0. In other embodiments, the spacer film may comprise a film of chemically vapor deposited (CVD) silicon nitride, which may be formed, for example, by the reaction of dichlorosilane or silane with ammonia in a reactor maintained at a temperature within the range of 300° C. to 800° C. A description of one example of suitable processing steps that may be used to form spacer structures is described, for example, in commonly assigned U.S. patent application Ser. No. 11/047,946, entitled "AYSMMETRIC SPACERS AND ASYMMETRIC SOURCE DRAIN EXTENSION LAYERS", and Filed on Feb. 1, 2005.

A source/drain implant may be performed to introduce source/drain regions 229 in the form of impurity distributions in the SOI layer 205. The source/drain regions 229 are formed using gate electrode 219 and the spacer structures 223, 225 and 227 as implant masks such that the source/drain regions 229 that result are effectively self-aligned (prior to any diffusion steps) to spacer structures 223, 225 and 227. In an n-channel transistor embodiment, the source/drain implant 229 typically utilizes an n-type species such as phosphorous or arsenic, while in a p-channel transistor embodiment, the source/drain implant 219 typically uses boron or another p-type dopant. The implantation steps utilized to form the source/drain regions 229 and the source/drain extensions 221 will typically be followed by a thermal anneal to induce diffusion of the implant ions into the substrate 203. It is to be noted that, in some embodiments of the methodologies described herein, the source/drain implant step may be performed instead after the spacer structure depicted in FIG. 10 has been achieved.

Figure 7:
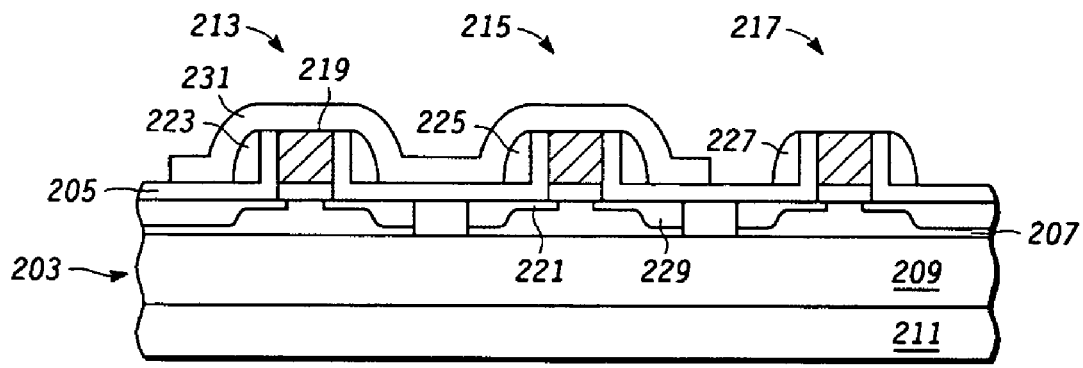
FIG. 7 is an illustration of one step in an embodiment of a process of the type described herein.
Figure 8:
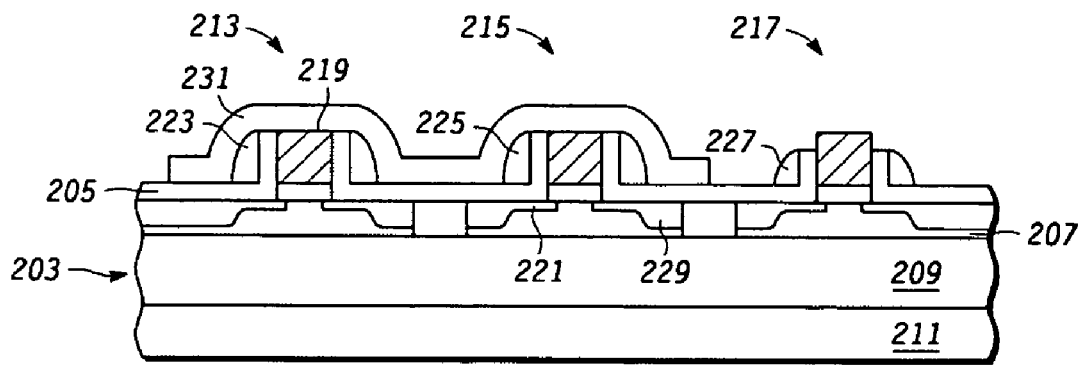
FIG. 8 is an illustration of one step in an embodiment of a process of the type described herein.

Referring now to FIG. 7, a layer of photoresist 231 is deposited and is patterned such that the first 213 and second 215 transistor devices are covered, and the third transistor device 217 is exposed. As seen in FIG. 8, the spacers 227 in transistor region 217 of the structure are then subjected to a recess etch to adjust these spacers to the desired dimensions.

Figure 9:
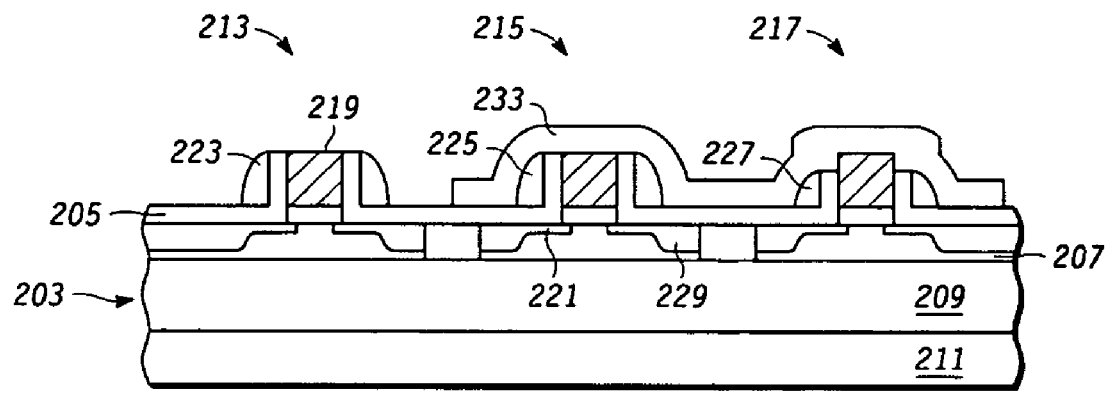
FIG. 9 is an illustration of one step in an embodiment of a process of the type described herein.
Figure 10:
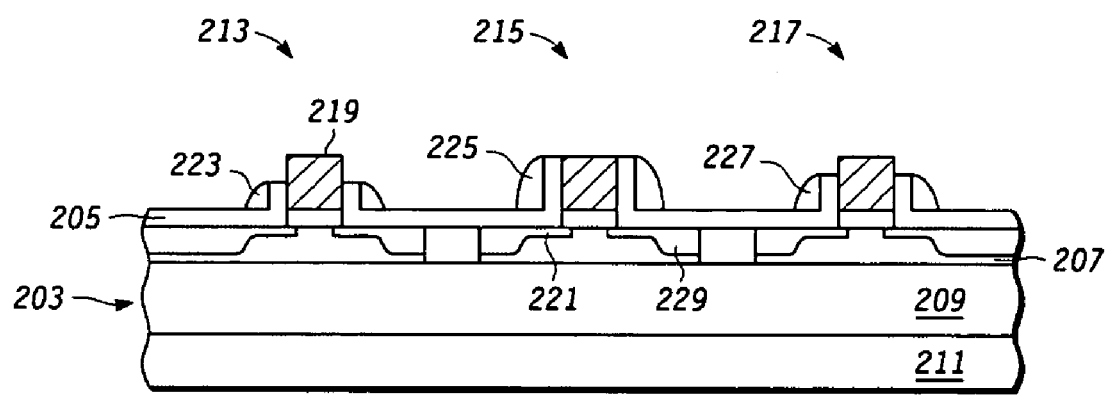
FIG. 10 is an illustration of one step in an embodiment of a process of the type described herein.

As shown in FIG. 9, the layer of photoresist 231 is then stripped with a suitable solvent, and a new layer of photoresist 233 is deposited over the structure. The layer of photoresist 233 is then patterned such that transistor region 213 is exposed. Then, as shown in FIG. 10, spacer structures 223 are subjected to a recess etch to achieve the desired spacer dimensions, after which photoresist layer 233 is stripped with a suitable solvent. If an overetch is desired in transistor region 215 to reduce the height of the spacer structures 225 below that of the gate (as might be desirable, for example, to expose additional surface area of the gate for silicidation, thereby allowing a uniform layer of silicide to be formed on a gate of smaller length), an additional masking and etching cycle of the type described above may be utilized to selectively etch the spacer structures 225 in that region of the device.

Figure 11:
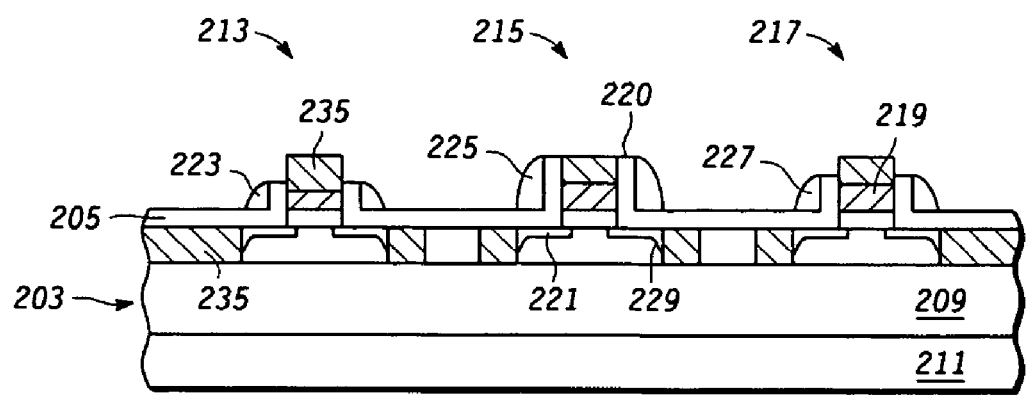
FIG. 11 is an illustration of one step in an embodiment of a process of the type described herein.

Referring now to FIG. 11, the device is then subjected to a silicidation process to define silicide regions 235 over the gates 219 and over the source and drain regions of the device defined by implant regions 221 and 229. In some embodiments, this step may be preceded by a dielectric etch to remove exposed portions of the gate dielectric 220 disposed on the sides of the gate electrodes 219. The device may then be completed using processes well known in the art to define contacts and other elements of the device.

It will be appreciated from the foregoing that, in contrast to the prior art process depicted in FIGS. 1-5 which utilizes a single etch to define the spacer structures for each of transistor regions 103, 105 and 107, in the process depicted in FIGS. 6-11, a separate etch is utilized to define each set of spacer structures 223, 225 and 227. Consequently, the duration, chemistry and anisotropy of the etch, and the dimensions of the spacer structures and recess depths achievable with this etch, may be separately optimized for each transistor region in the device independently of the other transistor regions in the device.

Moreover, compared to the prior art process depicted in FIGS. 1-5, the process of FIGS. 6-11 offers improved process simplicity. In particular, in order to achieve a structure with three different spacer widths, the prior art process of FIGS. 1-5 requires three separate deposition steps and three etch steps (including a global etch to realize the final structures). By contrast, the process of FIGS. 6-11 achieves a structure with three different spacer widths using the same number of mask and etch steps, but only a single deposition step.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
providing a semiconductor structure comprising (a) a substrate, (b) first and second gate electrodes disposed over the substrate, and (c) first and second sets of spacer structures disposed adjacent to said first and second gate electrodes, respectively, wherein each of said first and second sets of spacer structures comprises a first and second spacer disposed on opposing sides of one of said first and second gate electrodes, wherein said a topmost surface of said first set of spacer structures is coplanar with said first gate electrode, and wherein a topmost surface of said second set of spacer structures is coplanar with said second gate electrode;
disposing a first layer of photoresist over the semiconductor structure such that the first set of spacer structures is exposed and the second set of spacer structures is covered;
partially etching the first set of spacer structures;
disposing a second layer of photoresist over the semiconductor structure such that the second set of spacer structures is exposed and the first set of spacer structures is covered; and
partially etching the second set of spacer structures.

2. The method of claim 1, wherein the first and second sets of spacer structures are etched such that they have substantially different dimensions.

3. The method of claim 1, wherein the semiconductor structure further comprises a third gate electrode disposed over the substrate and having a third set of spacer structures disposed adjacent thereto, and wherein the first and second layers of photoresist also cover the third set of spacer structures.

4. The method of claim 3, further comprising:
disposing a third layer of photoresist over the semiconductor structure such that the third set of spacer structures is exposed and the first and second sets of spacer structures are covered; and
partially etching the third set of spacer structures.

5. The method of claim 4, wherein the first, second and third sets of spacer structures are etched such that they have substantially different dimensions.

6. The method of claim 5, wherein at least two of the first, second and third sets of spacer structures are subjected to a recess etch.

7. The method of claim 1, wherein the first and second sets of spacer structures are etched with first and second distinct etches.

8. The method of claim 1, wherein the first and second sets of spacer structures are etched with first and second distinct etchants.

9. The method of claim 1, wherein the first and second sets of spacer structures are etched for first and second distinct durations.

10. The method of claim 1, wherein the first and second sets of spacer structures are subjected to a recess etch, and wherein the first and second gate electrodes are subjected to silicidation.

11. The method of claim 1, wherein each of said first and second gate electrodes has first and second sidewalls, and wherein said first and second sets of spacer structures are disposed adjacent to said sidewalls.

12. The method of claim 11, wherein said first and second sets of spacer structures are disposed adjacent to said first and second sidewalls, and are separated therefrom by a layer of gate oxide.

13. The method of claim 12, wherein the etch used to partially etch the first set of spacer structures does not remove the layer of gate oxide.

14. The method of claim 1, further comprising the step of forming a deep implant region in the substrate after the first and second sets of spacer structures are etched.

15. A method for making a semiconductor device, comprising:
providing a semiconductor structure comprising (a) a substrate, (b) first, second and third gate electrodes disposed over the substrate, and (c) first, second and third sets of spacer structures disposed adjacent to said first, second and third gate electrodes, respectively, wherein each of said first, second and third sets of spacer structures comprises a first and second spacer disposed on opposing sides of one of said first, second and third gate electrodes wherein said a topmost surface of said first set of spacer structures is coplanar with said first gate electrode, and wherein a topmost surface of said second set of spacer structures is coplanar with said second gate electrode;

disposing a first layer of photoresist over the semiconductor structure such that the first set of spacer structures is exposed and the second set of spacer structures is covered;

partially etching the first set of spacer structures;

disposing a second layer of photoresist over the semiconductor structure such that the second set of spacer structures is exposed and the first set of spacer structures is covered; and partially etching the second set of spacer structures.

16. The method of claim 15, further comprising the steps of:

disposing a third layer of photoresist over the semiconductor structure such that the third set of spacer structures is exposed and the first and second sets of spacer structures are covered; and partially etching the third set of spacer structures.

17. The method of claim 16, further comprising the step of forming deep implant regions in the substrate adjacent to each of said first, second and third sets of spacer structures.

18. The method of claim 15, wherein each of the first, second and third sets of spacer structures have different dimensions.

* * * * *